United States Patent
Yang et al.

(10) Patent No.: US 7,342,750 B2
(45) Date of Patent: Mar. 11, 2008

(54) METHOD FOR PROVIDING ELECTRICAL CROSSOVER IN A LAMINATED STRUCTURE

(75) Inventors: Chao-Hui Yang, Milpitas, CA (US); Yen Fu, San Jose, CA (US); Li-Yan Zhu, San Jose, CA (US); Manny Hernandez, San Jose, CA (US); Ellis T. Cha, San Ramon, CA (US); Yong Luo, Livermore, CA (US)

(73) Assignee: Sae Magnetics (H.K.) Ltd., Shatin, N.T. (HK)

( * ) Notice: Subject to any disclaimer, the term of this patent is extended or adjusted under 35 U.S.C. 154(b) by 482 days.

(21) Appl. No.: 10/870,082

(22) Filed: Jun. 16, 2004

(65) Prior Publication Data
US 2005/0280944 A1    Dec. 22, 2005

(51) Int. Cl.
*G11B 5/48* (2006.01)
(52) U.S. Cl. .................... 360/245.9; 360/245.2
(58) Field of Classification Search ............ 360/245.8, 360/245.9, 245.2, 246
See application file for complete search history.

(56) References Cited

U.S. PATENT DOCUMENTS

| 5,717,547 | A  | * | 2/1998  | Young ...................... 360/246 |
| 5,805,382 | A  | * | 9/1998  | Lee et al. ................ 360/244.1 |
| 6,801,401 | B2 | * | 10/2004 | Aoyagi et al. ........... 360/245.8 |
| 7,092,215 | B2 | * | 8/2006  | Someya et al. ............ 360/246 |
| 2005/0180053 | A1 | * | 8/2005 | Dovek et al. ............... 360/246 |
| 2005/0219756 | A1 | * | 10/2005 | Dugas et al. .............. 360/241 |

* cited by examiner

*Primary Examiner*—Jefferson Evans
(74) *Attorney, Agent, or Firm*—Kenyon & Kenyon LLP

(57) ABSTRACT

An externally wireless laminated suspension for a hard disk drive are disclosed. In one embodiment, the externally wireless laminated suspension has an insulating layer to electrically isolate a first and second electrical trace from a conductive support layer. The second electrical trace crosses over the first electrical trace. The first electrical trace may be made of a first part on one side of the second electrical trace and a second part on the opposite side of the electrical trace. A conductive island area may be patterned into the support layer. The conductive island area may electrically couple the first part of the first electrical trace to the second part. The number of crossover points that the first electrical trace has may equal the number of crossover points that the second electrical trace has.

22 Claims, 10 Drawing Sheets

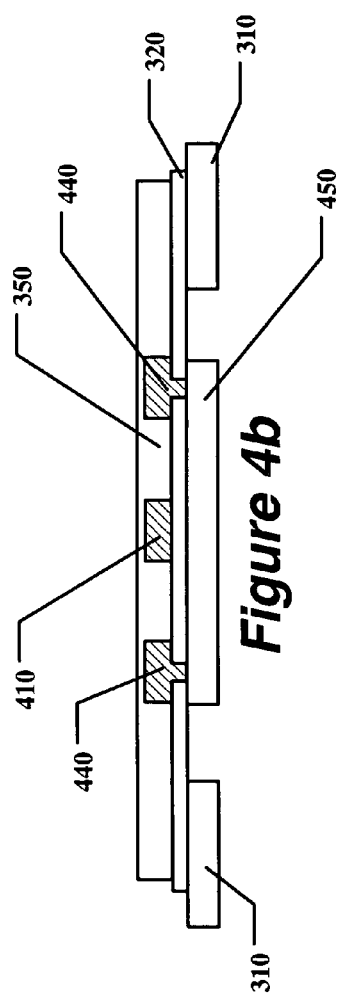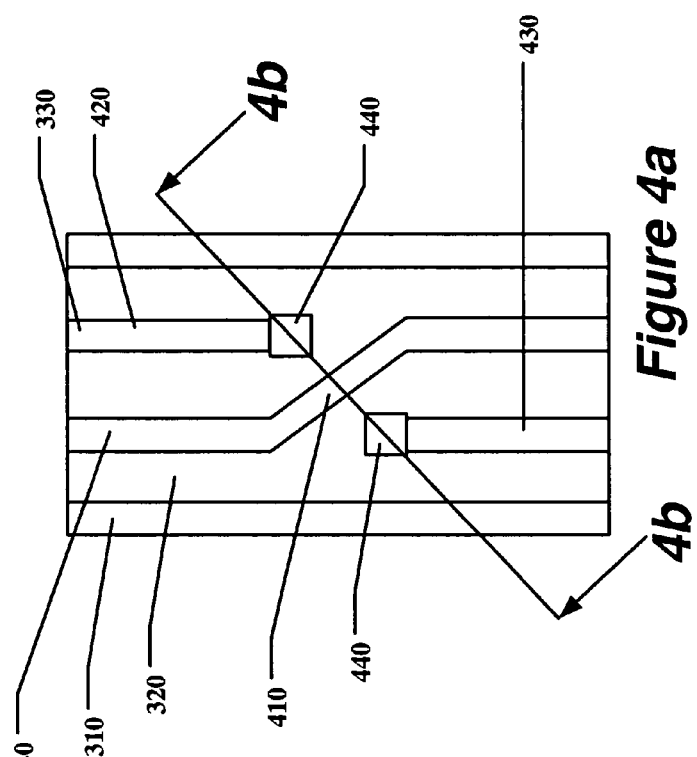

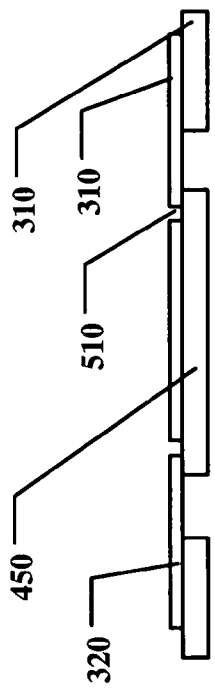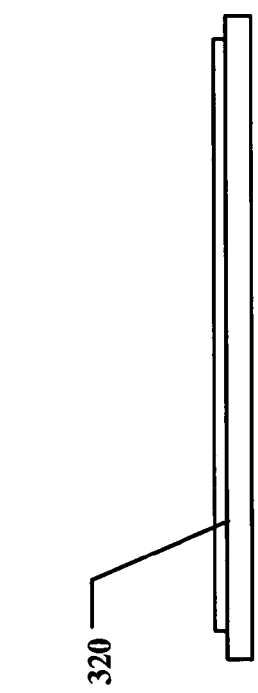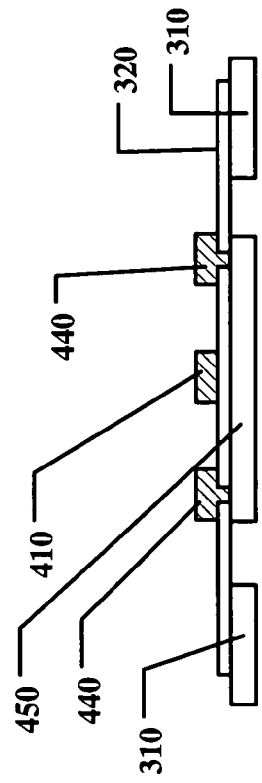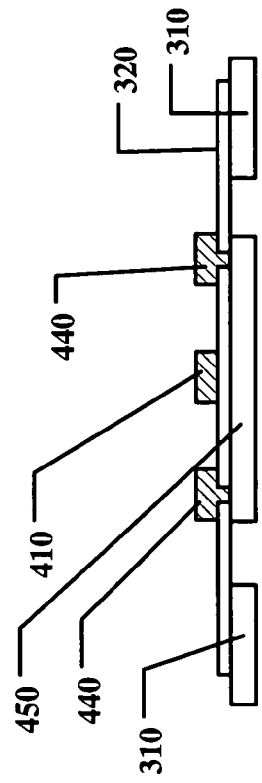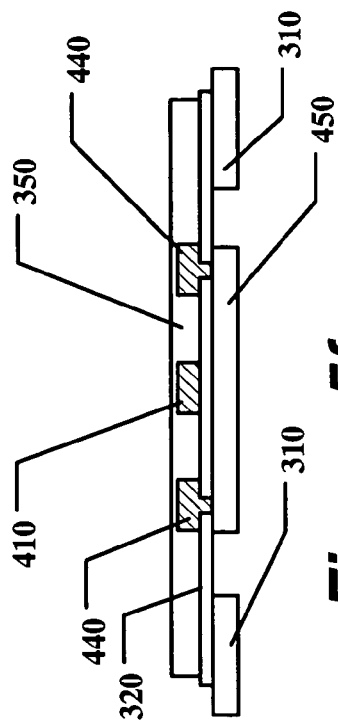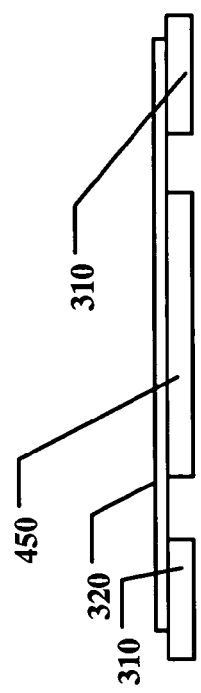

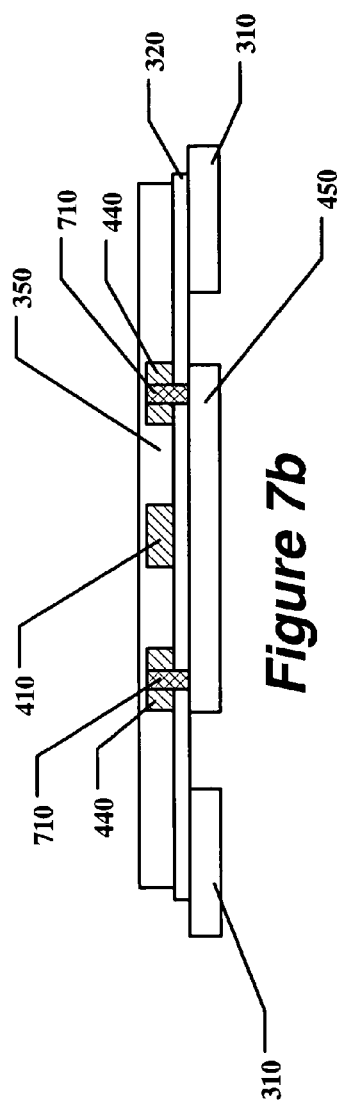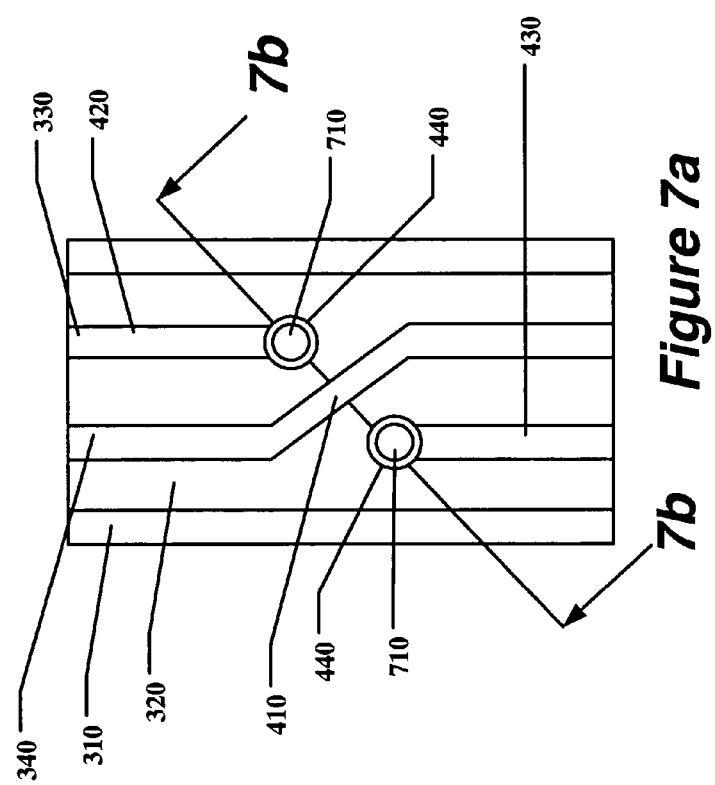
Figure 7b
Figure 7a

METHOD FOR PROVIDING ELECTRICAL CROSSOVER IN A LAMINATED STRUCTURE

BACKGROUND INFORMATION

The present invention relates to magnetic hard disk drives. More specifically, the present invention relates to fabricating a crossover structure on a laminated hard disk suspension.

Hard disk drives are common information storage devices essentially consisting of a series of rotatable disks, or other magnetic storage mediums, that are accessed by magnetic reading and writing elements. These data transferring elements, commonly known as transducers, are typically carried by and embedded in a slider body that is held in a close relative position over discrete data tracks formed on a disk to permit a read or write operation to be carried out. In order to properly position the transducer with respect to the disk surface, an air bearing surface (ABS) formed on the slider body experiences a fluid air flow that provides sufficient lift force to "fly" the slider and transducer above the disk data tracks. The high speed rotation of a magnetic disk generates a stream of air flow or wind along its surface in a direction substantially parallel to the tangential velocity of the disk. The air flow cooperates with the ABS of the slider body which enables the slider to fly above the spinning disk. In effect, the suspended slider is physically separated from the disk surface through this self-actuating air bearing.

Some of the major objectives in ABS designs are to fly the slider and its accompanying transducer as close as possible to the surface of the rotating disk, and to uniformly maintain that constant close distance regardless of variable flying conditions. The height or separation gap between the air bearing slider and the spinning magnetic disk is commonly defined as the flying height. In general, the mounted transducer or read/write element flies only approximately a few micro-inches above the surface of the rotating disk. The flying height of the slider is viewed as one of the most critical parameters affecting the magnetic disk reading and recording capabilities of a mounted read/write element. A relatively small flying height allows the transducer to achieve greater resolution between different data bit locations on the disk surface, thus improving data density and storage capacity. With the increasing popularity of lightweight and compact notebook type computers that utilize relatively small yet powerful disk drives, the need for a progressively lower flying height has continually grown.

FIG. 1 illustrates a hard disk drive design typical in the art. Hard disk drives 100 are common information storage devices consisting essentially of a series of rotatable disks 104 that are accessed by magnetic reading and writing elements. These data transferring elements, commonly known as transducers, are typically carried by and embedded in a slider body 110 that is held in a close relative position over discrete data tracks formed on a disk to permit a read or write operation to be carried out. The slider is held above the disks by a suspension. The suspension has a load beam and flexure allowing for movement in a direction perpendicular to the disk. The suspension is rotated around a pivot by a voice coil motor to provide coarse position adjustments. A micro-actuator couples the slider to the end of the suspension and allows fine position adjustments to be made.

In order to properly position the transducer with respect to the disk surface, an air bearing surface (ABS) formed on the slider body 110 experiences a fluid air flow that provides sufficient lift force to "fly" the slider 110 (and transducer) above the disk data tracks. The high speed rotation of a magnetic disk 104 generates a stream of air flow or wind along its surface in a direction substantially parallel to the tangential velocity of the disk. The airflow cooperates with the ABS of the slider body 110 which enables the slider to fly above the spinning disk. In effect, the suspended slider 110 is physically separated from the disk surface 104 through this self-actuating air bearing. The ABS of a slider 110 is generally configured on the slider surface facing the rotating disk 104, and greatly influences its ability to fly over the disk under various conditions. To control the in-plane motion of the slider, especially to access various data tracks on the disk surface, the head suspension assembly (HSA) typically incorporates a primary actuator. The primary actuator may be a voice coil located at the end opposite the read/write head. Due to the large inertia of the HSA, the primary actuator has limited bandwidth. Vibration of the suspension makes it difficult to control the read/write head position from a distance. The primary actuator along has difficulty achieving the speed and accuracy of position required.

Advanced disk drive design incorporates a secondary actuator, or micro-actuator, between the read/write head and the pivotal axis of the HSA. The stroke, or distance of displacement in relation to the voltage applied, of these micro-actuators is typically in the order of 1 µm. FIG. 2a illustrates a micro-actuator with a U-shaped ceramic frame configuration 201. The frame 201 is made of, for example, Zirconia. The frame 201 has two arms 202 opposite a base 203. A slider 204 is held by the two arms 202 at the end opposite the base 203. A strip of piezoelectric material 205 is attached to each arm 202. A bonding pad 206 allows the slider 204 to be electronically connected to a controller. FIG. 2b illustrates the micro-actuator as attached to an actuator suspension flexure 207 and load beam 208. The microactuator can be coupled to a suspension tongue 209. Traces 210, coupled along the suspension flexure 207, connect the strips of piezoelectric material 205 to a set of connection pads 211. Voltages applied to the connection pads 211 cause the strips 205 to contract and expand, moving the placement of the slider 204. The suspension flexure 207 can be attached to a base plate 212 with a hole 213 for mounting on a pivot via a suspension hinge 214. A tooling hole 215 facilitates handling of the suspension during manufacture and a suspension hole 216 lightens the weight of the suspension.

A pre-amplifier is electrically connected to the slider to supply write currents to the write head and receive read back data from the read head. The suspension flexure 207 may be manufactured to serve the dual purposes of mechanical support and electrically connecting the slider to the preamplifier. Most of the suspensions used today are externally wireless, where the electrical connection is done through metal traces embedded in the suspension as a laminated structure. A cross-section of one embodiment of this laminate structure is shown in FIG. 3. A support layer 310 provides support for the structure. The support layer 310 may be metal or some other conductor. An insulating layer 320 may be laminated on top of the support layer 310. A first electrical trace 330 and a second electrical trace 340 to connect the slider to the pre-amplifier may be laminated on top of the insulating layer 320. The insulating layer 320 electrically isolates the electrical traces 330 from the supporting layer 310. An insulating covering coat 350 protects and electrically isolates the first electrical trace 330 and the second electrical trace 340.

In the wireless suspension of FIG. 3, the read trace may sense the write current going through the adjacent write trace. The write current may then produce current through the read head through induction, creating cross talk. Cross talk may degrade the reliability of the read head.

BRIEF DESCRIPTION OF THE DRAWING

FIGS. 4a-b provide an illustration of a laminated suspension with a crossover electrical trace according to an embodiment of the present invention.

FIGS. 5a-f provide an illustration of a process for manufacturing a laminated suspension with a crossover electrical trace according to an embodiment of the present invention.

FIGS. 7a-b provide an illustration of an alternate embodiment of a laminated suspension with a crossover electrical trace.

DETAILED DESCRIPTION

Figure 1:
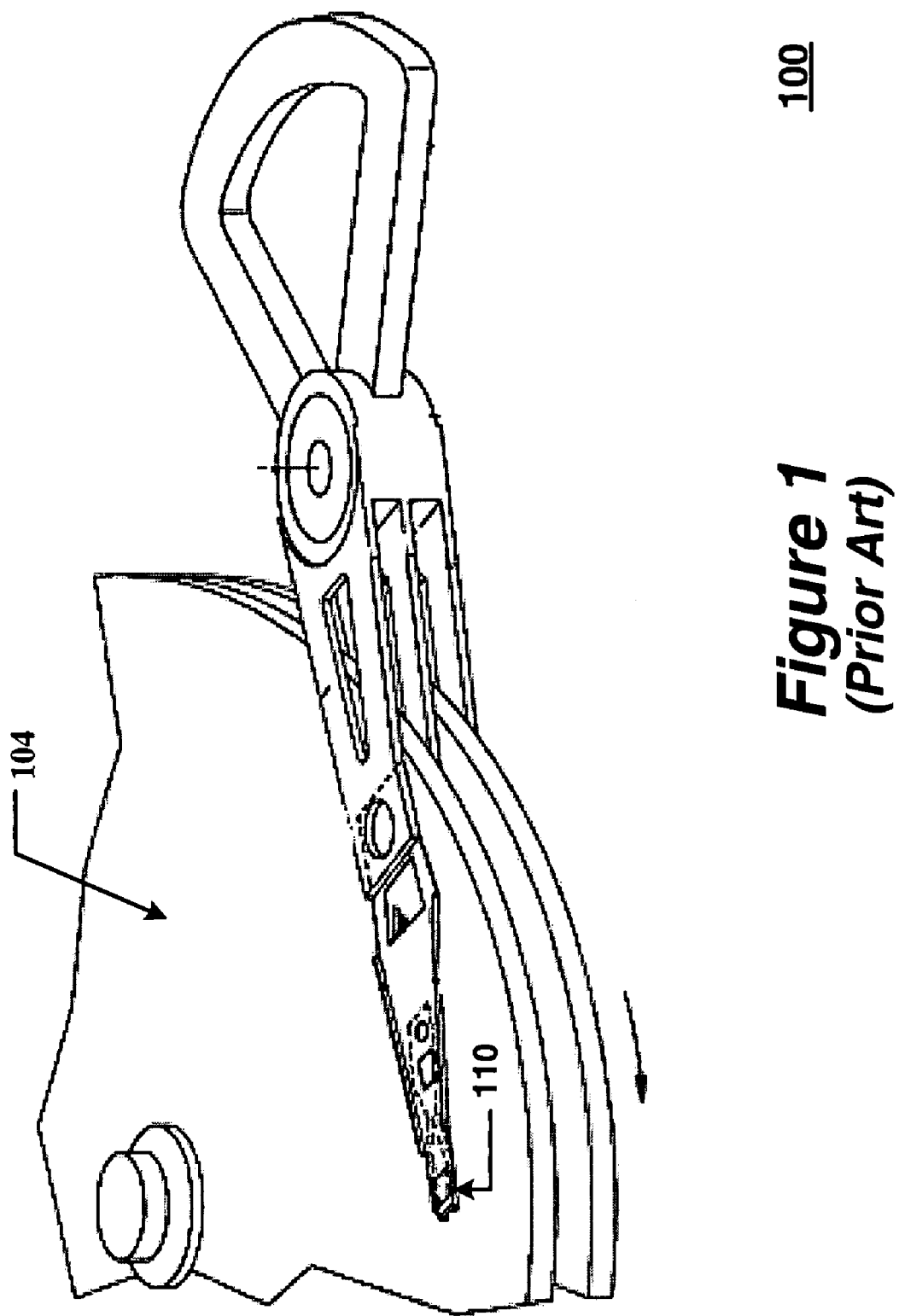
FIG. 1 provides an illustration of a typical disk drive.
Figure 2:
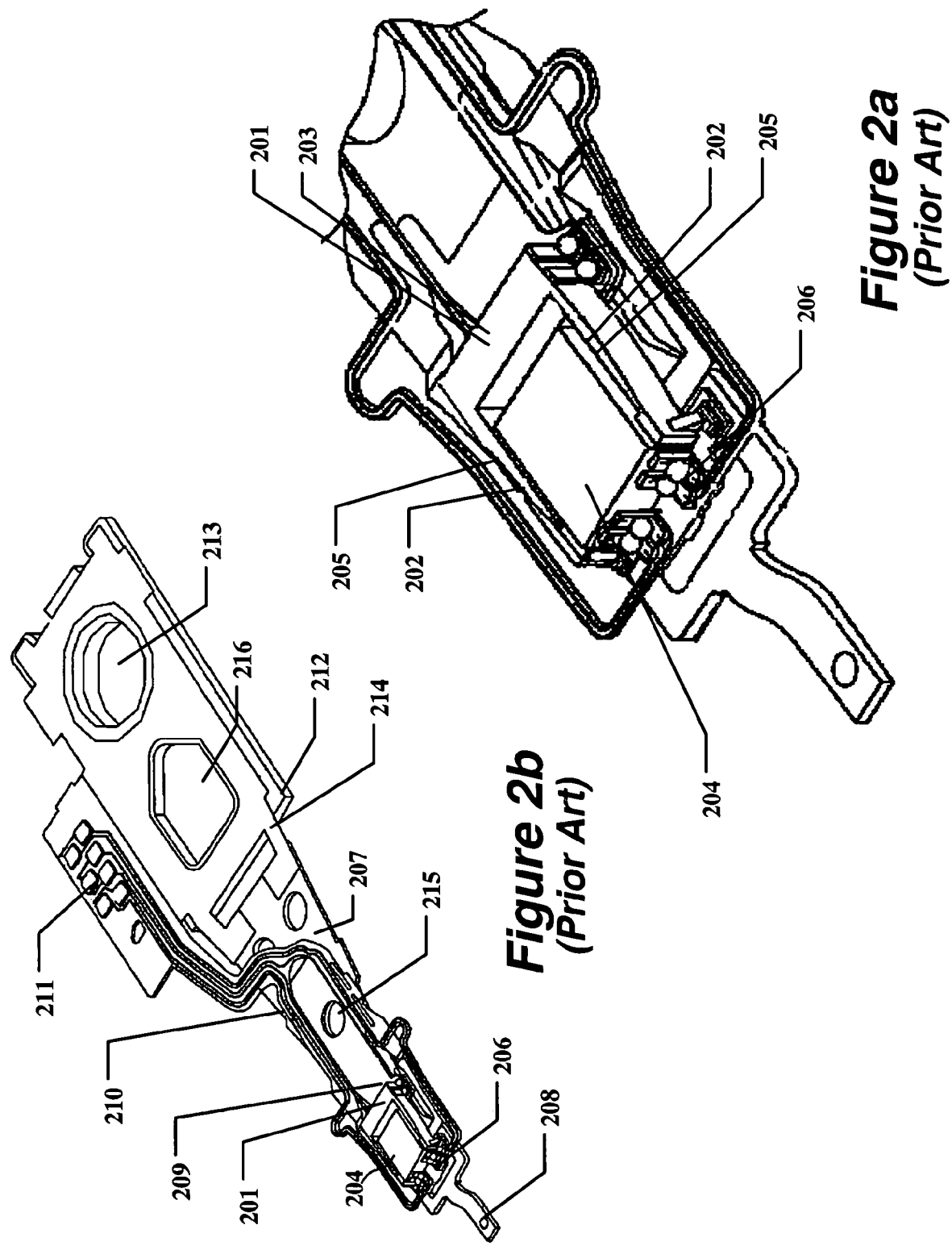
FIGS. 2a-b provides one illustration of an actuator as practiced in the prior art.
Figure 3:
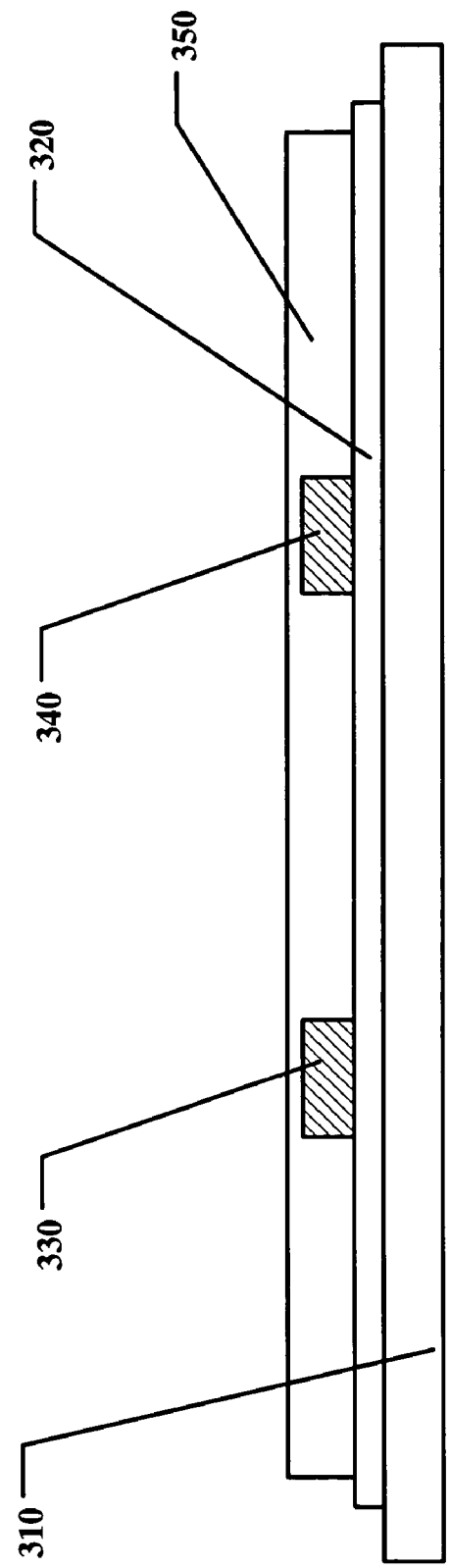
FIG. 3 provides an illustration of a cross section of an externally wireless laminated suspension according to the prior art.

An externally wireless laminated suspension for a hard disk drive is disclosed. In one embodiment, the externally wireless laminated suspension has an insulating layer to electrically isolate a first and second electrical trace from a conductive support layer. The second electrical trace crosses over the first electrical trace. The first electrical trace may be made of a first part on one side of the second electrical trace and a second part on the opposite side of the electrical trace. A conductive island area may be patterned into the support layer. The conductive island area may electrically couple the first part of the first electrical trace to the second part. The number of crossover points that the first electrical trace has may equal the number of crossover points that the second electrical trace has.

FIG. 4a in top view and FIG. 4b in cross-section illustrate one embodiment of a laminated suspension using a crossover feature of the present invention. In the embodiment, the laminated suspension has a support layer 310, an insulating layer 320, a first electrical trace 330, a second electrical trace 340 and an insulating covering coat 350. The second electrical trace 340 crosses over the first electrical trace 330 at a crossover point 410. The first electrical trace 330 may be discrete, or non-continuous, with a first part 420 and second part 430 of the first electrical trace 330 ending in contact points 440 on either side of the second electrical trace 340 at the crossover point 410. Underneath the crossover point 410, a conductive island area 450 is patterned into the support layer 310. The conductive island area 450 is electrically isolated from the rest of the support layer 310 by a gap and the second electrical trace 340 by the insulating layer 320. The conductive island area electrically connects the contact points 440 of the first electrical trace 330, allowing a signal to be sent from the first part 420 of the electrical trace 330 to the second part 430. The crossover points may help to reduce the signal cross talk between read traces and write traces.

Figure 6:
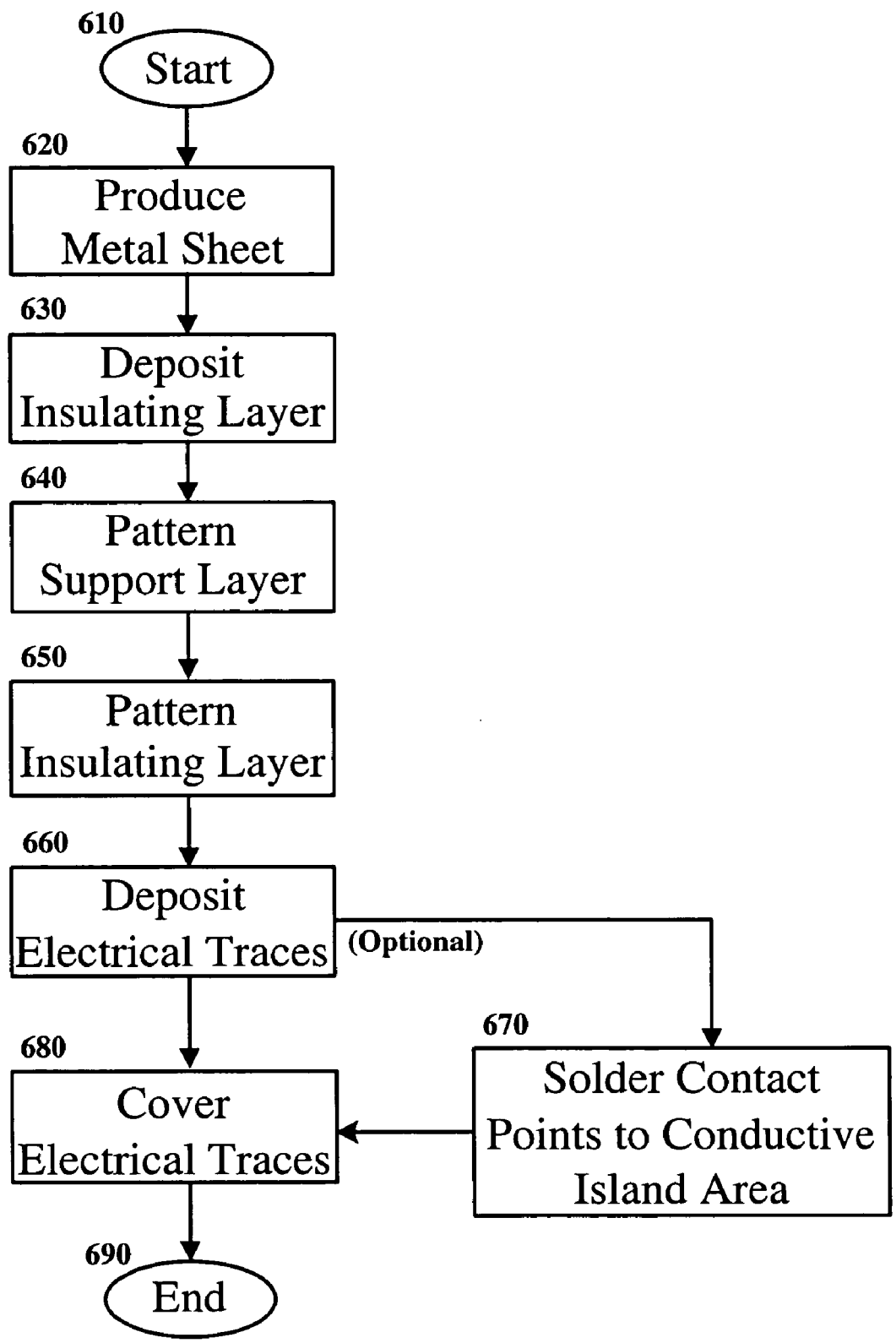
FIG. 6 provides a flowchart of a process for manufacturing a laminated suspension with a crossover electrical trace according to an embodiment of the present invention.

FIGS. 5a-f show in a series of diagrams and FIG. 6 shows in a flowchart one embodiment of a method for constructing a laminated suspension with crossover electrical traces. The process may start (Block 610) by producing a sheet of metal or other conductive material to act as the support layer 310 (Block 620), as shown in FIG. 5a. An insulator layer 320 may be deposited on the support layer 310 (Block 630), as shown in FIG. 5b. A conductive island area 450 may be patterned onto the support layer 310 (Block 640), as shown in FIG. 5c. Access points 510 may be patterned into the insulating layer 320 to allow the contact points 440 to be electrically coupled to the conductive island area 450 (Block 650), as shown in FIG. 5d. The first electrical trace 330 and second electrical trace 340 may be deposited or laminated on the insulating layer 320 in the crossover pattern desired (Block 660), as shown in FIG. 5e. At this time, the contact points 440 may form in the access points 510 to electrically connect with the conductive island area 450 through the insulating layer 320. Alternatively, a conductive epoxy or solder 710 may be used to connect the contact point 420 to the conductive island area 450 through the access point 510 of the insulating layer 320 (Block 670), as shown in top view in FIG. 7a and in cross-section in FIG. 7b. An insulating covering coat 350 may cover the first electrical trace 330 and the second electrical trace 340 (Block 670), as shown in FIG. 5f, ending the process (Block 680).

Figure 8:
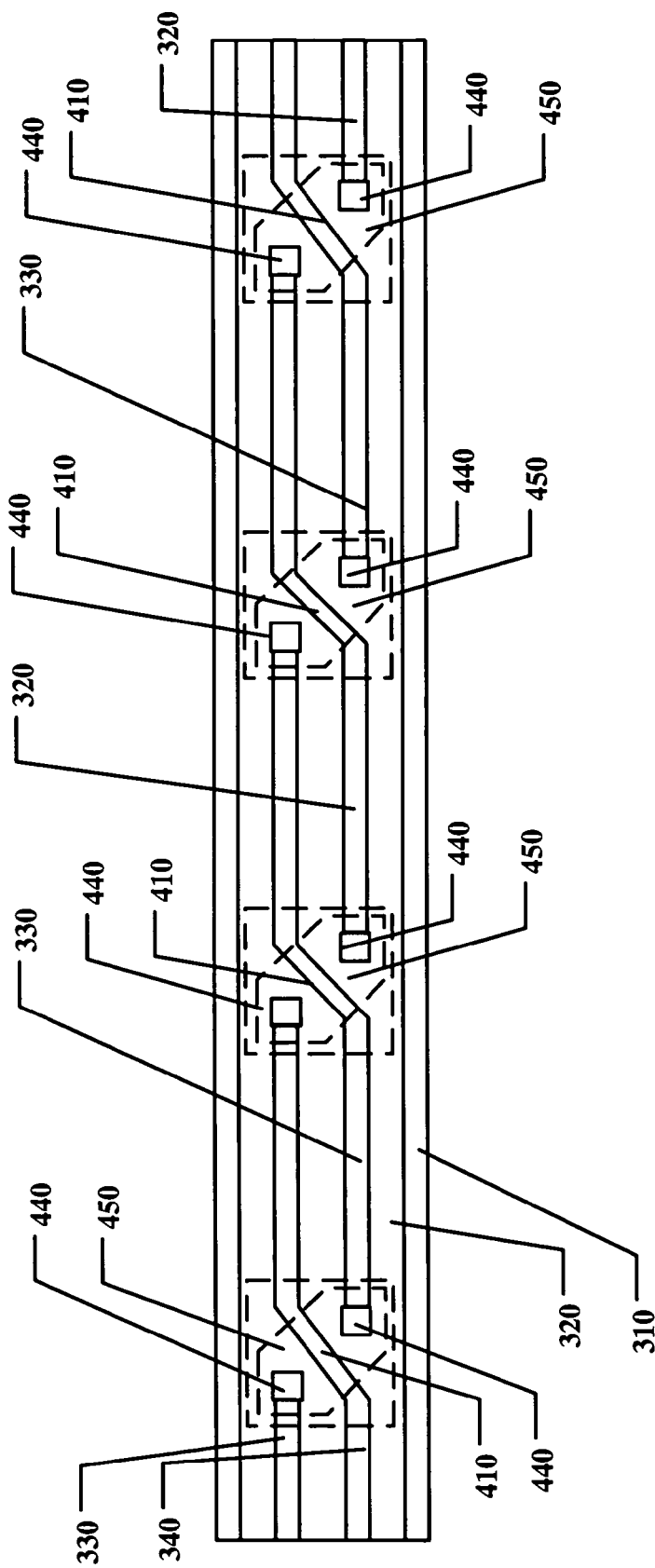
FIG. 8 provides an illustration of a laminated suspension with an electrical trace with multiple crossovers according to an embodiment of the present invention.

FIG. 8 shows one embodiment of a laminated suspension with multiple crossover points 410. A separate conductive island area 450 may be patterned underneath each crossover point 410 to prevent signal bleed between the first electrical trace 330 and the second electrical trace 340. The effect of the different electrical properties between the electrical traces and the conductive island area 450 may be counteracted by having the same number of crossover points 410 for the first electrical trace 330 as for the second electrical trace 340.

Figure 9:
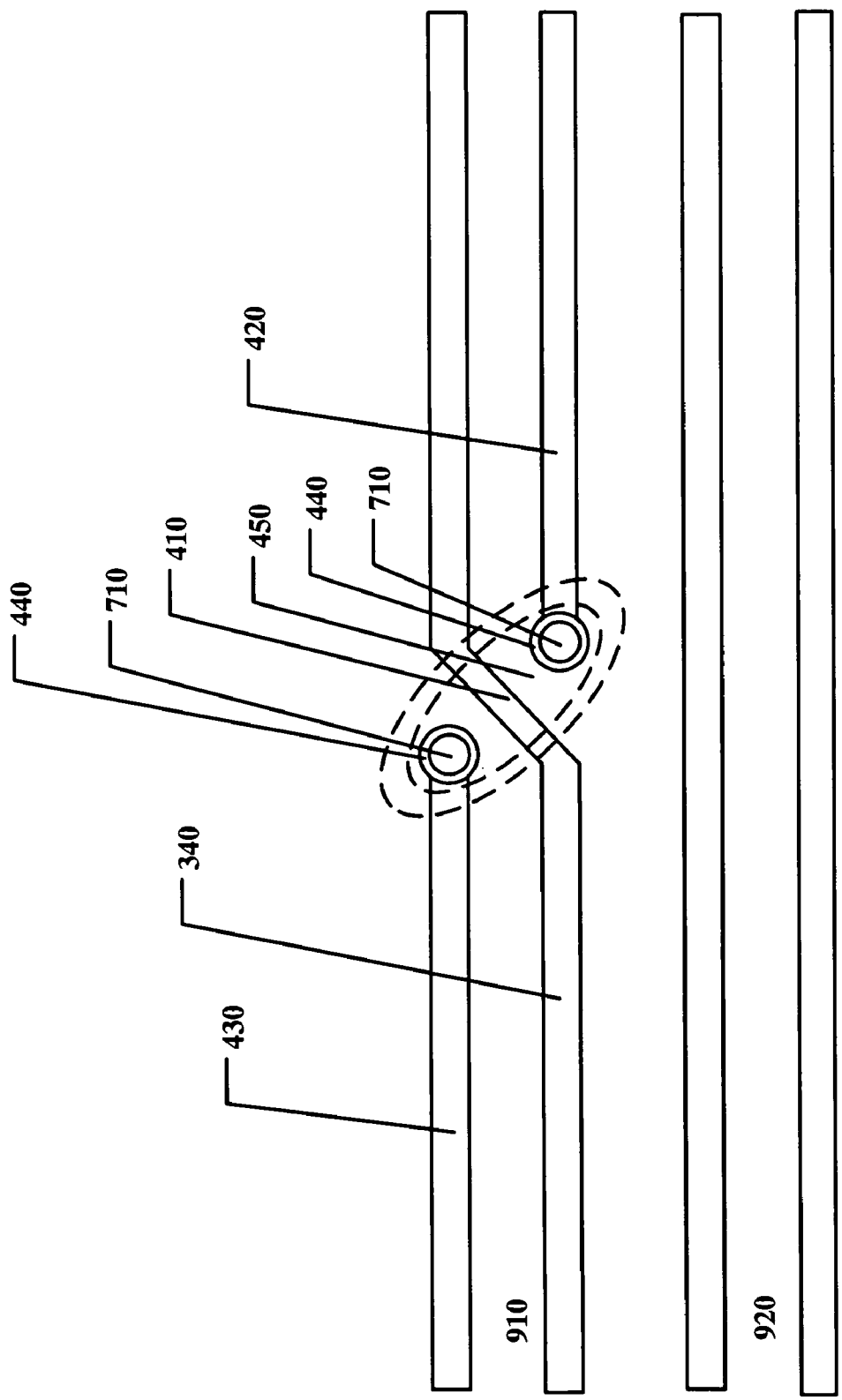
FIG. 9 provides an illustration of a sample coupon for testing an embodiment of the present invention.
Figure 10:
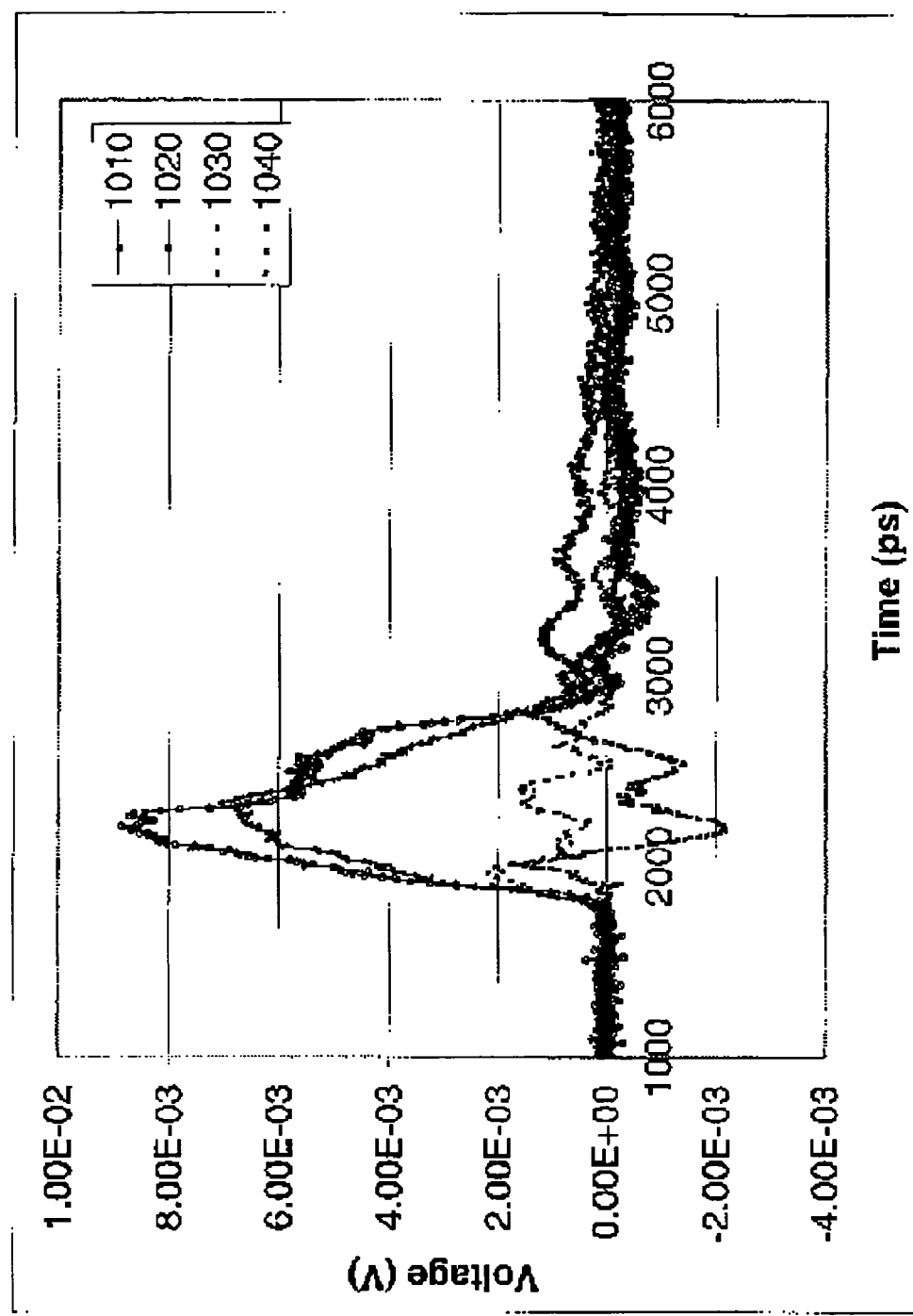
FIG. 10 provides an illustration in graph form of the results of testing an embodiment of the present invention.

The improvement in cross talk reduction caused by the crossovers may be observed on coupon samples. Two coupons with the same spacing between reader and writer pairs may be built. FIG. 9 illustrates in a top view a coupon with a crossover point 410 in the read pair 910, and no crossover in the writer pair. A second coupon may have no crossover points. A step function of 200 mV and 50 pS rise time may be applied to the writer trace pairs of both coupons. The results are shown in graph form in FIG. 10. The near end voltage differences 1010 and 1020 may be recorded for two coupon samples not having any crossover points. The near end voltage differences 1030 and 1040 may be recorded for two coupon samples with crossover points. The far end voltage differences for the same coupon samples are similar as the results described in FIG. 10 but are not shown here. The average cross talk is reduced to about 25% for a coupon type with one or more crossover points compared with a coupon type without any crossover points. The test result indicates only a small resistance non-uniformity around the crossover structure due to different conductivities of the two different metal layers.

Although several embodiments are specifically illustrated and described herein, it will be appreciated that modifications and variations of the present invention are covered by the above teachings and within the purview of the appended claims without departing from the spirit and intended scope of the invention.

The invention claimed is:

1. A laminated suspension, comprising:
   a support layer;
   a non-continuous first trace electrically connecting a slider to a pre-amplifier;
   a second trace electrically connecting the slider to the pre-amplifier, the second trace to cross over the non-continuous first trace at a first trace crossover point, and to remain electrically isolated from the non-continuous first trace; and
   an insulating layer isolating the non-continuous first trace and the second trace from the first support layer.

2. The laminated suspension of claim 1, further comprising an insulating covering coat covering the non-continuous first trace and the second trace.

3. The laminated suspension of claim 1, wherein the support layer is conductive.

4. The laminated suspension of claim 3, wherein the non-continuous first trace has a first trace part and a second trace part.

5. The laminated suspension of claim 4, wherein the first trace part is separated from the second trace part by the second trace and the first trace part is electrically connected to the second trace part by the support layer at the first trace crossover point.

6. The laminated suspension of claim 5, further comprising a first conductive island area patterned into the first support layer at the first trace crossover point, the first conductive island area to electrically connect the first trace part to the second trace part and to be electrically isolated from the second trace.

7. The laminated suspension of claim 6, wherein the first trace part and the second trace part are electrically connected to the first conductive island area by solder.

8. The laminated suspension of claim 6, wherein the first trace part and the second trace part are electrically connected to the first conductive island area by conductive epoxy.

9. The laminated suspension of claim 6, wherein the first trace part and the second trace part are electrically connected to the first conductive island area by plating conductive material.

10. The laminated suspension of claim 6, wherein:
    the second trace has a third trace part and a fourth trace part;
    the third trace part is separated from the fourth trace part by the non-continuous first trace; and
    the third trace part is electrically connected to the fourth trace part by a second conductive island area patterned into the first support layer at a second trace crossover point.

11. The laminated suspension of claim 1, wherein the non-continuous first trace and the second trace have equal number of crossover points.

12. A hard disk drive, comprising:
    a data storage disk;
    a slider containing a magnetic read/write head to read and write date from the data storage disk;
    a pre-amplifier to amplify a control signal to the slider and the magnetic read/write head; and
    a laminated suspension comprising:
        a support layer
        a non-continuous first trace electrically connecting the slider to the pre-amplifier;
        a second trace electrically connecting the slider to the pre-amplifier, the second trace crossing over the non-continuous first trace at a first trace crossover point, yet remaining electrically isolated from the non-continuous first trace; and
        an insulating layer isolating the non-continuous first trace and the second trace from the first support layer.

13. The hard disk drive of claim 12, further comprising an insulating covering coat covering the non-continuous first trace and the second trace.

14. The hard disk drive of claim 12, wherein the support layer is conductive.

15. The hard disk drive of claim 14, wherein the non-confnuous first trace has a first trace part and a second trace part.

16. The hard disk drive of claim 15, wherein the first trace part is separated from the second trace part by the second trace and the first trace part is electrically connected to the second trace part by the support layer at the first trace crossover point.

17. The hard disk drive of claim 16, further comprising a first conductive island area patterned into the first support layer at the first trace crossover point, the first conductive island area to electrically connect the first trace part to the second trace part and to be electrically isolated from the second trace.

18. The hard disk drive of claim 17, wherein the first trace part and the second trace part are electrically connected to the first conductive island area by solder.

19. The hard disk drive of claim 17, wherein the first trace part and the second trace part are electrically connected to the first conductive island area by conductive epoxy.

20. The hard disk drive of claim 17, wherein the first trace part and the second trace part are electrically connected to the first conductive island area by plating conductive material.

21. The hard disk drive of claim 17, wherein:
    the second trace has a third trace part and a fourth trace part;
    the third trace part is separated from the fourth trace part by the non-continuous first trace; and
    the third trace part is electrically connected to the fourth trace part by a second conductive island area patterned into the first support layer at a second trace crossover point.

22. The hard disk drive of claim 12, wherein the non-continuous first trace and the second trace have equal number of crossover points.

* * * * *